United States Patent
Lee et al.

(10) Patent No.: US 11,970,672 B2
(45) Date of Patent: Apr. 30, 2024

(54) CLEANING LIQUID COMPOSITION FOR SEMICONDUCTOR WAFER AND CLEANING METHOD USING SAME

(71) Applicant: YOUNG CHANG CHEMICAL CO., LTD, Gyeongsangbuk-do (KR)

(72) Inventors: Seung Hun Lee, Daegu (KR); Seung Hyun Lee, Daegu (KR); Seong Hwan Kim, Daegu (KR); Seung Oh Jin, Daegu (KR)

(73) Assignee: YOUNG CHANG CHEMICAL CO., LTD, Gyeongsangbuk-do (KR)

( * ) Notice: Subject to any disclaimer, the term of this patent is extended or adjusted under 35 U.S.C. 154(b) by 177 days.

(21) Appl. No.: 17/435,078

(22) PCT Filed: Feb. 10, 2020

(86) PCT No.: PCT/KR2020/001802
§ 371 (c)(1),
(2) Date: Aug. 31, 2021

(87) PCT Pub. No.: WO2020/184846
PCT Pub. Date: Sep. 17, 2020

(65) Prior Publication Data
US 2022/0135903 A1 May 5, 2022

(30) Foreign Application Priority Data
Mar. 8, 2019 (KR) .................. 10-2019-0026849

(51) Int. Cl.
| | |
|---|---|
| C11D 1/72 | (2006.01) |
| B08B 3/08 | (2006.01) |
| B08B 3/12 | (2006.01) |
| C11D 3/04 | (2006.01) |
| C11D 3/20 | (2006.01) |
| C11D 3/43 | (2006.01) |
| H01L 21/02 | (2006.01) |

(52) U.S. Cl.
CPC .................. *C11D 1/72* (2013.01); *B08B 3/08* (2013.01); *B08B 3/12* (2013.01); *C11D 3/042* (2013.01); *C11D 3/2082* (2013.01); *C11D 3/2086* (2013.01); *C11D 3/43* (2013.01); *H01L 21/02052* (2013.01); *C11D 2111/22* (2024.01)

(58) Field of Classification Search
None
See application file for complete search history.

(56) References Cited

U.S. PATENT DOCUMENTS

| | | | |
|---|---|---|---|
| 2005/0020463 A1 | 1/2005 | Ikemoto et al. | |
| 2015/0111804 A1* | 4/2015 | Dory ................... | C11D 3/0073 510/175 |

FOREIGN PATENT DOCUMENTS

| | | |
|---|---|---|
| CN | 1639846 A | 7/2005 |
| JP | 2009-215620 A | 9/2009 |
| KR | 10-2004-0077805 A | 9/2004 |
| KR | 10-0725891 B1 | 6/2007 |
| KR | 10-2015-0017154 A | 2/2015 |
| KR | 10-2017-0001122 A | 1/2017 |
| KR | 10-2017-0095537 A | 8/2017 |
| KR | 10-2017-0105549 A | 9/2017 |
| KR | 10-1799282 B1 | 11/2017 |
| KR | 10-2019-0015412 A | 2/2019 |
| KR | 10-2062342 B1 | 1/2020 |

\* cited by examiner

*Primary Examiner* — Eric W Golightly
*Assistant Examiner* — Arlyn I Rivera-Cordero
(74) *Attorney, Agent, or Firm* — NKL Law; Jae Youn Kim

(57) ABSTRACT

A semiconductor wafer cleaning composition for used in a semiconductor device manufacturing process and a method of cleaning a semiconductor wafer using the cleaning composition are provided. The cleaning composition includes surfactants represented by Formula 1 and Formula 2, respectively, an organic or inorganic acid, and water occupying for the remaining proportion. The cleaning method is a method of immersing a semiconductor wafer in the cleaning composition for 100 to 500 seconds. The cleaning composition and the cleaning method according to the present disclosure provide an incredibility improved removal rate and an effective cleaning power for contaminants, especially organic wax, during a process of polishing the surface of a wafer used to manufacture semiconductor devices, thereby providing a super-cleaned wafer surface, resulting in production of reliable semiconductor devices.

6 Claims, No Drawings

CLEANING LIQUID COMPOSITION FOR SEMICONDUCTOR WAFER AND CLEANING METHOD USING SAME

CROSS-REFERENCE TO RELATED APPLICATIONS

This application claims priority from International Application, PCT/KR2020/001802, filed Feb. 10, 2020, which claims priority from Korean Patent Application No. 10-2019-0026849, filed on Mar. 8, 2019, the entire contents of which are hereby incorporated by reference.

TECHNICAL FIELD

The present disclosure relates to a cleaning liquid composition used to clean a semiconductor wafer and a method of cleaning a semiconductor wafer using the same.

BACKGROUND ART

With the advancement and development of semiconductor devices, the removal of defects and contamination sources such as organic materials and metals on a wafer, which is the basis of semiconductor device, is becoming more important.

A wafer made of polycrystalline silicon as a raw material is widely used as a base substrate for semiconductor devices and is typically manufactured though growing a single crystal column called an ingot, slicing the ingot into wafers, and lapping, etching, polishing, and cleaning the wafers.

In a process of polishing one surface of a wafer, a chemical mechanical polishing device is used. In the process, a wafer is attached to a carrier using an organic wax (oil-soluble wax or water-soluble wax), which is a kind of adhesive, and the wafer is brought into contact with and is pressed against the top surface of a polishing pad. In this state, the carrier and a turntable rotate about their respective drive shafts. The contact surface of the wafer attached to the carrier is rubbed by the polishing pad to be polished to be become a mirror surface.

Since the finished surface of the wafer having undergone the polishing is covered with a large amount of wax used as an adhesive and with contaminants generated during the polishing process, the wax and the contaminants must be completely removed through a cleaning process. If the wax and contaminants are not completely removed, the yield of production of semiconductor devices is reduced.

(Patent Literature 1) Korean Patent No. 10-0725891
(Patent Literature 2) Korean Patent No. 10-1799282
(Patent Literature 3) Korean Patent Application Publication No. 10-2017-0095537
(Patent Literature 4) Korean Patent Application Publication No. 10-2017-0105549

DISCLOSURE

Technical Problem

The present disclosure is intended to solve the above problems, and the objective of the present disclosure is to provide a semiconductor wafer cleaning liquid composition that can effectively remove organic materials, especially organic wax used in a polishing process.

Technical Solution

To achieve the objective, the present disclosure provides a cleaning liquid composition for a semiconductor wafer, the cleaning liquid composition including: nonionic surfactants represented by Formula 1 and Formula 2 below; an inorganic or organic acid; and deionized water.

$$R_1-(AO)_n-R_2 \quad \text{[Formula 1]}$$

(In the above formula, $R_1$ and $R_2$ are each independently a hydrogen atom (—H), a hydroxyl group (—OH), a linear or branched alkyl group having 1 to 20 carbon atoms, or a linear or branched alkyl group having 1 to 20 carbon atoms, A is an alkylene group having 2 to 4 carbon atoms, and n is an integer in a range of 1 to 20).

$$R_3-(AO)_n-R_4 \quad \text{[Formula 2]}$$

(In the above formula, $R_3$ and $R_4$ are each independently a hydrogen atom (—H), a hydroxyl group (—OH), a linear or branched alkyl group having 1 to 20 carbon atoms, or a linear or branched alkyl group having 1 to 20 carbon atoms, A is an alkylene group having 2 to 4 carbon atoms, and m is an integer in a range of 5 to 25).

In a preferred embodiment of the present disclosure, the nonionic surfactants are included in an amount of 0.1% to 40% by weight with respect to the total weight of the cleaning liquid composition, and the weight ratio of the nonionic surfactants respectively represented by Formula 1 and Formula 2 is in a range of 3:1 to 1:3.

In a preferred embodiment of the present invention, the organic acid may be sulfonic acid or carboxylic acid, the sulfonic acid may be methane sulfonic acid or para-toluene sulfonic acid, and the carboxylic acid may be at least one selected from the group consisting of valeric acid, glycolic acid, glutaric acid, butyric acid, maleic acid, malonic acid, malic acid, benzoic acid, salicylic acid, succinic acid, citric acid, anisic acid, acetic acid, oxalic acid, lactic acid, formic acid, fumaric acid, propanoic acid, and phthalic acid.

In a preferred embodiment of the present disclosure, the inorganic acid may be at least one selected from the group consisting of hydrochloric acid, phosphoric acid, nitric acid, and sulfuric acid.

In a preferred embodiment of the present disclosure, the organic acid and the inorganic acid may be included in an amount of 0.01% to 5% by weight with respect to the total weight of the cleaning composition.

In a preferred embodiment of the present invention, a semiconductor wafer cleaning method using the wafer cleaning composition may be a semiconductor wafer cleaning method in which a semiconductor wafer is immersed in the cleaning composition for 100 to 500 seconds.

In a preferred embodiment of the present disclosure, a semiconductor wafer cleaning method using the wafer cleaning composition is a semiconductor wafer cleaning method in which a wafer is immersed in the cleaning composition while applying ultrasonic waves.

In a preferred embodiment of the present invention, a semiconductor wafer cleaning method using the wafer cleaning composition may be a semiconductor wafer cleaning method in which a semiconductor wafer is immersed in the cleaning composition and then washed with deionized water 1 to 5 times.

In a preferred embodiment of the present invention, a semiconductor wafer cleaning method using the wafer cleaning composition may be a semiconductor wafer cleaning method in which a semiconductor wafer is immersed in the cleaning composition that is at a temperature in a range of 40° C. to 80° C.

Advantageous Effects

The cleaning liquid composition according to the present disclosure provides significantly increased removal efficiency and effective cleaning power for contaminants, particularly organic waxes, on the surface of a wafer used to manufacture semiconductor devices. With the use of the cleaning liquid composition, the surface of a wafer can be extraordinarily cleaned, thereby exhibiting the effect of manufacturing highly reliable semiconductor devices.

BEST MODE

Unless otherwise defined, all terms including technical and scientific terms used herein have the same meaning as commonly understood by those who are ordinarily skilled in the art to which this invention belongs. Herein, the nomenclature that is well known and commonly used in the art will be used.

It will be further understood that the terms "comprises", "includes", or "has", when used in this specification, specify the presence of an element, but do not preclude the presence or addition of one or more other elements unless the context clearly indicates otherwise.

A cleaning liquid composition according to the present disclosure is a solution used for cleaning a semiconductor wafer, and it includes nonionic surfactants represented by Chemical Formulas 1 and 2, an organic or inorganic acid, and deionized water.

When the cleaning liquid composition is used in a cleaning process for removing contaminants (specifically, organic wax) from the surface of a wafer, the wettability of the wafer surface is improved since the surface tension of the wafer surface is lowered by the nonionic surfactants represented by respective Chemical Formulas 1 and 2. Therefore, it is possible to easily remove the organic wax and to prevent the removed wax particles from re-adhering to the wafer surface. That is, the cleaning effect is remarkably increased, resulting in highly reliable semiconductor devices.

The cleaning liquid composition for a semiconductor wafer of the present disclosure includes nonionic surfactants represented by Formulas 1 and 2, respectively.

  [Formula 1]

In Formula 1, $R_1$ and $R_2$ are each independently a hydrogen atom (—H), a hydroxyl group (—OH), a linear or branched alkyl group having 1 to 20 carbon atoms, or a linear or branched alkyl group having 1 to carbon atoms, A is an alkylene group having 2 to 4 carbon atoms, and n is an integer in a range of 1 to 25.

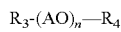  [Formula 2]

In Formula 2, $R_3$ and $R_4$ are each independently a hydrogen atom (—H), a hydroxyl group (—OH), a linear or branched alkyl group having 1 to 20 carbon atoms, or a linear or branched alkyl group having 1 to carbon atoms, A is an alkylene group having 2 to 4 carbon atoms, and m is an integer in a range of 5 to 25).

According to the present disclosure, the surfactants are added to improve the solubility of the wax to be removed, and an appropriate surfactant may be selected depending on the wax to be removed. For example, a nonionic surfactant may be used alone or in combination of two or more inorganic surfactants.

According to the present disclosure, the amount of the nonionic surfactants is not particularly limited, but the content of the nonionic surfactants is preferably 0.01 to 40% by weight with respect to the total weight of the cleaning liquid composition.

When the content of the nonionic surfactants is lower than 0.01% by weight, the effect of removing contaminants may be insignificant. On the other hand, the content is higher than 40% by weight, increase in the effect of removing contaminants may be insignificant because it is difficult for the surfactants to be dissolved.

For these aspects, the nonionic surfactants may be preferably included in an amount of 0.1% to 40% by weight.

According to the present disclosure, the cleaning liquid composition for a semiconductor wafer may contain an acidic compound.

The acidic compound decomposes and dissolves impurities remaining on the surface of the wafer which is to be cleaned and causes electrical repulsion between wax particles dissolved in the cleaning liquid to improve dispersion of the wax particles, thereby improving cleaning power.

The acidic compound is not particularly limited to a specific one as long as it is acidic. For example, an inorganic acid, an organic acid, or a mixture thereof may be used. The acidic compound also acts as a pH adjuster to maintain a proper pH.

As a specific example of the inorganic acid, any one selected from the group consisting of phosphoric acid, nitric acid, and sulfuric acid may be solely used, or a mixture of two or more ones selected from the same group may be used.

More specific examples of the organic acid include carboxylic acid and sulfonic acid. Examples of the carboxylic acid include formic acid, acetic acid, propanoic acid, butyric acid, valeric acid, benzoic acid, anisic acid, oxalic acid, malonic acid, succinic acid, glutaric acid, maleic acid, fumaric acid, phthalic acid, salicylic acid, glycolic acid, lactic acid, malic acid, and citric acid. Examples of the sulfonic acid include methane sulfonic acid and paratoluene sulfonic acid. Each of the acidic compounds may be used solely, or two or more acidic compounds may be used in combination.

The content of the organic or inorganic acid is not particularly limited, but the content of the organic or inorganic acid is preferably 0.01 to 5% by weight with respect to the total weight of the cleaning liquid composition. With the content falling within the range, the cleaning power may be highest.

When the content of the inorganic or organic acid is less than 0.01% by weight, the cleaning effect may be insignificant. On the contrary, when it exceeds 5% by weight, the cleaning effect may also be insignificant because the pH of the cleaning liquid composition exceeds an appropriate pH range.

According to the present disclosure, water functions to dissolve each component and adjust the overall composition, and the remaining proportion of the total composition is occupied by water. Preferably, the components described above are adjusted to fall within the respective specified ranges.

The water used is not particularly limited, but it is preferable to use deionized water commonly used as water for semiconductor device manufacturing processes and having a specific resistance of 18 MΩcm or more.

The composition for cleaning a semiconductor wafer, according to the present invention, may be used as it is, or it may be diluted with deionized water for use to be a 1:10 to 1:100 dilution.

A semiconductor wafer cleaning method using the semiconductor wafer cleaning composition of the present invention may be a method of immersing a semiconductor wafer in the cleaning composition for 100 to 500 seconds.

The semiconductor wafer cleaning method using the semiconductor wafer cleaning composition of the present invention may exhibit an excellent cleaning effect by using ultrasonic waves in during the cleaning.

The semiconductor wafer cleaning method using the semiconductor wafer cleaning composition of the present invention has an excellent cleaning effect when the semiconductor wafer cleaning composition of the present invention is used under heating so that the temperature of the cleaning composition becomes 40° C. to 80° C. as well as when the cleaning composition is at mom temperature.

The semiconductor wafer cleaning method using the semiconductor wafer cleaning composition of the present invention can exhibit an excellent cleaning effect when the semiconductor water cleaned with the semiconductor wafer cleaning composition of the present invention is washed with deionized water 1 to 5 times.

Hereinafter, the semiconductor wafer cleaning liquid composition of the present invention will be described in more detail with reference to Examples and Comparative Examples. These examples are presented for only illustrative purposes, and it will be apparent to those who are ordinarily skilled in the art that the scope of the present disclosure should not be construed as being limited by these examples.

MODE FOR INVENTION

Examples and Comparative Examples

According to the compositions and composition ratios shown in Table 1 below, semiconductor wafer cleaning liquid compositions of Examples 1 to 15 and Comparative Examples 1 to 7 were prepared.

TABLE 1

| Classification | Surfactant | | | | | Acid | | Deionized water |
| --- | --- | --- | --- | --- | --- | --- | --- | --- |
| | A (Formula 1) | | B (Formula 2) | | | C | | |
| | Component | % by weight | Component | % by weight | A:B | Component | % by weight | D % by weight |
| Example 1 | a1 | 7.5 | b1 | 22.5 | 1:3 | c1 | 0.5 | 69.5 |
| Example 2 | a1 | 10.0 | b1 | 20.0 | 1:2 | c1 | 0.5 | 69.5 |
| Example 3 | a1 | 15.0 | b1 | 15.0 | 1:1 | c2 | 0.5 | 69.5 |
| Example 4 | a1 | 20.0 | b1 | 10.0 | 2:1 | c3 | 0.5 | 69.5 |
| Example 5 | a1 | 22.5 | b1 | 7.5 | 3:1 | c4 | 0.5 | 69.5 |
| Example 6 | a2 | 7.5 | b1 | 22.5 | 1:3 | c1 | 0.5 | 69.5 |
| Example 7 | a2 | 10.0 | b1 | 20.0 | 1:2 | c1 | 0.5 | 69.5 |
| Example 8 | a2 | 15.0 | b1 | 15.0 | 1:1 | c4 | 0.5 | 69.5 |
| Example 9 | a2 | 20.0 | b1 | 10.0 | 2:1 | c4 | 0.5 | 69.5 |
| Example 10 | a2 | 22.5 | b1 | 7.5 | 3:1 | c5 | 0.5 | 69.5 |
| Example 11 | a1 | 15.0 | b2 | 15.0 | 1:1 | c1 | 0.5 | 69.5 |
| Example 12 | a1 | 20.0 | b2 | 10.0 | 2:1 | c1 | 0.5 | 69.5 |
| Example 13 | a1 | 22.5 | b2 | 7.5 | 3:1 | c5 | 0.5 | 69.5 |
| Example 14 | a2 | 15.0 | b2 | 15.0 | 1:1 | c5 | 0.1 | 69.5 |
| Example 15 | a2 | 22.5 | b2 | 7.5 | 3:1 | c6 | 1.0 | 69.5 |
| Comparative Example 1 | a3 | 22.5 | b3 | 7.5 | 3:1 | c1 | 0.5 | 69.5 |
| Comparative Example 2 | a3 | 20.0 | b3 | 10.0 | 2:1 | c1 | 0.5 | 69.5 |
| Comparative Example 3 | a3 | 22.5 | b4 | 7.5 | 3:1 | c1 | 0.5 | 69.5 |
| Comparative Example 4 | a3 | 20.0 | b4 | 10.0 | 2:1 | c1 | 0.5 | 69.5 |
| Comparative Example 5 | a4 | 22.5 | b3 | 7.5 | 3:1 | c1 | 0.5 | 69.5 |
| Comparative Example 6 | a4 | 15.0 | b3 | 15.0 | 1:1 | c1 | 0.5 | 69.5 |
| Comparative Example 7 | a4 | 22.5 | b4 | 7.5 | 3:1 | c1 | 0.5 | 69.5 | a1: $C_nH_{2n+1}$—O—$(EO)_x$—H (n = 2, x = 12, EO = oxyethylene group)
a2: $C_nH_{2n+1}$—O—$(EO)_x$—H (n = 16, x = 12)
a3: $C_nH_{2n+1}$-(phenyl)-O—$(EO)_x$—H (n = 2, x = 10)
a4: $C_nH_{2n+1}$-(phenyl)-O—$(EO)_x$—H (n = 15, x = 10)
b1: $C_nH_{2n+1}$—$(EO)_x$—H (n = 10, x = 8)
b2: $C_nH_{2n+1}$—$(EO)_x$—H (n = 13, x = 8)
b3: $C_nH_{2n+1}$—O—$(EO)_x(PO)_y$—H (n = 9, x = 10, y = 5)
b4: EO/PO block copolymer (EO:PO = 1:1, Mw = 2,500, PO = oxypropylene group)
c1: citric acid
c2: glutaric acid
c3: oxalic acid
c4: phosphoric acid
c5: sulfuric acid
c6: sulfonic acid

[Experimental Example 1] Wax Removal Power Evaluation

A 4-inch P-type silicon wafer was prepared, and the initial weight of the wafer was measured. Next, the wafer was placed such that the mirror surface thereof faces up, and 3 cc of wax (manufacturer: Nikka Seiko Co. Ltd., model name: Skyliquid) was coated on the wafer at a speed of 2,500 rpm for 30 seconds using a spin coater (manufacturer: TEL, model name: Mark-VZ). Next, the wafer was heated at 100° C. for 60 seconds and cooled at 23° C. for 30 seconds. Next, the weight of the wafer was measured.

Cleaning compositions of Examples and Comparative Examples shown in Table 1 were prepared and heated to 65° C. The processed wafers were immersed in the respective cleaning compositions for 300 seconds, taken out from the respective cleaning compositions, and washed by dipping the wafers in cleaning basins containing deionized water three times for 10 seconds per each time, and dried with high purity nitrogen gas.

The weights of the dried wafers were measured, and the wax removal rate (cleaning power) of each cleaning composition was calculated according to an equation shown below.

Wax removal rate (%)=100×[(weight of wafer after wax coating−weight of wafer after cleaning)/(weight of wafer after wax coating−weight of wafer before wax coating)]

The results are shown in Table 2 below.

TABLE 2

| No. | Wax removal rate (%) | No. | Wax removal rate (%) |
|---|---|---|---|
| Example 1 | 94.5 | Example 12 | 97.5 |
| Example 2 | 95.0 | Example 13 | 98.0 |
| Example 3 | 95.0 | Example 14 | 97.0 |
| Example 4 | 95.5 | Example 15 | 98.5 |
| Example 5 | 95.5 | Comparative Example 1 | 89.5 |
| Example 6 | 95.5 | Comparative Example 2 | 87.5 |
| Example 7 | 96.0 | Comparative Example 3 | 86.5 |
| Example 8 | 96.0 | Comparative Example 4 | 87.5 |
| Example 9 | 96.5 | Comparative Example 5 | 89.0 |
| Example 10 | 99.4 | Comparative Example 6 | 86.9 |
| Example 11 | 97.0 | Comparative Example 7 | 88.0 |

Referring to Table 2, it was confirmed that the cleaning liquid compositions of Examples 1 to 15 exhibited an excellent cleaning power of 94.5% to 99.4%.

On the other hand, since the cleaning compositions of Comparative Examples 1 to 7 showed a cleaning power of 86.5% to 89.5%, it was confirmed that the cleaning power was greatly reduced and a large amount of wax component remained.

[Experimental Example 2] Contaminant Reattachment Evaluation

A 4-inch P-type silicon wafer was prepared, and the initial weight of the wafer was measured. Next, the wafer was placed such that the mirror surface thereof faces up, and 3 cc of wax (manufacturer: Nikka Seiko Co. Ltd., model name: Skyliquid) was coated on the wafer at a speed of 2,500 rpm for 30 seconds using a spin coater (manufacturer: TEL, model name: Mark-VZ). Next, the wafer was heated at 100° C. for 60 seconds and cooled at room temperature 30 seconds.

The cleaning compositions of Examples and Comparative Examples described in Table 1 were prepared, and wax-coated 4-inch wafers were immersed in the respective cleaning compositions contained in cleaning basins and maintained at a temperature of 65° C. for 300 seconds so that the wax was dissolved in the cleaning compositions. After that, the wafers were taken out and washed three times for 10 seconds per each time in a cleaning basin containing deionized water, and the wafers were dried with high purity nitrogen gas.

The dried wafers were observed with an optical microscope.

The results are shown in Table 3 below.

TABLE 3

| No. | Prevention of reattachment | No. | Prevention of reattachment |
|---|---|---|---|
| Example 1 | ○ | Example 12 | ○ |
| Example 2 | ○ | Example 13 | ◎ |
| Example 3 | ○ | Example 14 | ◎ |
| Example 4 | ○ | Example 15 | ○ |
| Example 5 | ◎ | Comparative Example 1 | X |
| Example 6 | ○ | Comparative Example 2 | Δ |
| Example 7 | ○ | Comparative Example 3 | Δ |
| Example 8 | ○ | Comparative Example 4 | X |
| Example 9 | ◎ | Comparative Example 5 | Δ |
| Example 10 | ◎ | Comparative Example 6 | X |
| Example 11 | ○ | Comparative Example 7 | X |

◎ (Very good): No reattachment of contaminants onto the wafer surface after cleaning (Very good)
○ (Good): No reattachment of contaminants onto the wafer surface after cleaning
Δ (Bad): Reattachment of contaminants onto the wafer surface after cleaning
X (Very bad): A lot of contaminants were reattached to the wafer surface after cleaning Referring to Table 3, the cleaning liquid compositions of Examples 1 to 15 showed very good or good results. That is, no or little reattachment of contaminants to the wafer surface after cleaning was observed.

On the other hand, it was confirmed that the cleaning compositions of Comparative Examples 1 to 7 showed poor or very bad results. That is, a lot of contaminants were reattached to the wafer surface after cleaning.

[Experimental Example 3] Metal Contaminants Removal Power Evaluation

Silicon wafers with a size of 30 mm (width)×30 mm (length) were prepared. The silicon wafers were washed with a solution including a mixture of aqueous ammonia and hydrogen peroxide and 1% hydrofluoric acid, and then were contaminated with iron, copper, nickel, aluminum, and lead powders in a surface concentration of $1.0 \times 10^{13}$ atoms/cm$^2$ using a spin coater.

Cleaning compositions of Examples and Comparative Examples shown in Table 1 were prepared. The contaminated wafers were immersed in the prepared cleaning compositions at 60° C. for 300 seconds without stirring. The wafers were then taken out and washed in cleaning basins containing deionized water three times for 10 seconds per each time, and dried with high purity nitrogen gas.

The concentration of metals on the surface of each dried wafer was measured with a secondary ion mass spectrometry (SIMS) to evaluate the ability to remove metal impurities.

The results are shown in Table 4 below.

TABLE 4

| Classification | Surface metal ion concentration ($\times 10^{10}$ atoms/cm$^2$) | | | | |
|---|---|---|---|---|---|
| | Fe | Cu | Ni | Al | Pb |
| Before cleaning | 3300 | 5100 | 3800 | 2500 | 2100 |
| Example 1 | 0.4 | 0.5 | 0.1 | 0.2 | 0.4 |
| Example 2 | 1.4 | 1.8 | 0.4 | 1.3 | 2.5 |
| Example 3 | 0.5 | 0.6 | Lower than lower limit of measurable range | 0.3 | 0.8 |

TABLE 4-continued

| Classification | Surface metal ion concentration ($\times 10^{10}$ atoms/cm$^2$) | | | | |
|---|---|---|---|---|---|
| | Fe | Cu | Ni | Al | Pb |
| Example 4 | 0.9 | 1.2 | 0.1 | 0.2 | 0.4 |
| Example 5 | 2.1 | 2.5 | 0.1 | 1.6 | 2.3 |
| Example 6 | 1.7 | 1.9 | 0.5 | 0.5 | 1.2 |
| Example 7 | 0.5 | 0.6 | 0.2 | 0.4 | 0.9 |
| Example 8 | 1.2 | 1.5 | 0.1 | 1.3 | 3.3 |
| Example 9 | 1.1 | 1.3 | 0.4 | 0.2 | 0.6 |
| Example 10 | 0.3 | Lower than lower limit of measurable concentration range | 0.1 | 0.2 | 0.2 |
| Example 11 | 0.4 | 0.5 | 0.2 | 0.5 | 1.2 |
| Example 12 | 0.6 | 0.6 | 0.2 | 0.7 | 1.7 |
| Example 13 | 0.6 | 0.7 | 0.1 | 0.2 | 0.8 |
| Example 14 | 2.3 | 2.9 | 0.6 | 1.9 | 4.9 |
| Example 15 | 0.5 | 0.6 | 0.2 | 0.5 | 1.4 |
| Comparative Example 1 | 47.0 | 17.9 | 12.1 | 152 | 3.5 |
| Comparative Example 2 | 21.8 | 68.2 | 45.1 | 55.8 | 13.1 |
| Comparative Example 3 | 6.7 | 34.2 | 54.7 | 12.0 | 1.3 |
| Comparative Example 4 | 18.1 | 33.4 | 23.6 | 30.6 | 7.9 |
| Comparative Example 5 | 17.9 | 26.7 | 17.1 | 20.5 | 3.7 |
| Comparative Example 6 | 14.7 | 12.8 | 7.7 | 10.7 | 3.5 |
| Comparative Example 7 | 24.4 | 24.8 | 15.8 | 18.8 | 5.3 |

Referring to Table 4, the cleaning liquid compositions of Examples 1 to 15 showed very good results. That is, the remaining metal ion concentration on the water surface after the cleaning was equal to or lower than $10 \times 10^{10}$ atoms/cm$^2$.

On the other hand, it was confirmed that the cleaning compositions of Comparative Examples 1 to 7 showed poor results. That is, the remaining metal ion concentration on the wafer surface after the cleaning was higher than $10 \times 10^{10}$ atoms/cm$^2$.

As described above, the present disclosure has been described with limited examples, but the present disclosure is not limited to the above examples, and various modifications and variations can be made on the basis of these examples by those skilled in the art to which the present invention pertains.

Therefore, the scope of the present invention should not be limited to the described examples or embodiments but should be defined by the following claims and equivalents.

The invention claimed is:

1. A method of cleaning a semiconductor wafer, the method comprising: (a) immersing a semiconductor wafer in a cleaning composition for 100 to 500 seconds; and (b) washing the semiconductor wafer taken out from the cleaning composition with deionized water,
  wherein the cleaning composition comprises:
  (a) 3% to 50% by weight of nonionic surfactants represented by Formulas 1 and 2 having a weight ratio in a range of 3:1 to 1:3, respectively;
  (b) 0.1% to 1% by weight of an inorganic acid; and
  (c) the remaining proportion of water,
  wherein the Formula 1 is composed of Formula a1 or Formula a2, the Formula a1 is CnH2n+1-O-(EO)x-H (n=2, x=12, EO=oxyethylene group), and the Formula a2 is CnH2n+1-O-(EO)x-H (n=16, x=12, EO=oxyethylene group),
  wherein the Formula 2 is composed of Formula b1 or Formula b2, the Formula b1 is CnH2n+1-(EO)x-H (n=10, x=8, EO=oxyethylene group), and the Formula b2 is CnH2n+1-(EO)x-H (n=13, x=8, EO=oxyethylene group), and
  wherein the inorganic acid is one acid selected from a group consisting of phosphoric acid, nitric acid, sulfuric acid, or a mixture of two or more acids selected from the group.

2. A method of cleaning a semiconductor wafer, the method comprising: (a) immersing a semiconductor wafer in a cleaning composition for 100 to 500 seconds; and (b) washing the semiconductor wafer taken out from the cleaning composition with deionized water,
  wherein the cleaning composition comprises:
  (a) 3% to 50% by weight of nonionic surfactants represented by Formulas 1 and 2 having a weight ratio in a range of 3:1 to 1:3, respectively;
  (b) 0.1% to 1% by weight of an inorganic acid; and
  (c) the remaining proportion of water,
  wherein the Formula 1 is composed of Formula a1 or Formula a2, the Formula a1 is $C_nH_{2n+1}$—O-(EO)$_x$—H (n=2, x=12, EO=oxyethylene group), and the Formula a2 is $C_nH_{2+1}$—O-(EO)$_x$—H (n=16, x=12, EO=oxyethylene group), and
  wherein the Formula 2 is composed of Formula b1 or Formula b2, the Formula b1 is $C_nH_{2n+1}$-(EO)$_x$—H (n=10, x=8, EO=oxyethylene group), and the Formula b2 is $C_nH_{2n+1}$-(EO)$_x$—H (n=13, x=8, EO=oxyethylene group).

3. The method of claim 2, wherein in the step (a) of the immersing of the semiconductor wafer in the cleaning composition, ultrasonic waves are applied.

4. The method of claim 2, wherein in the step (a) of the immersing of the semiconductor wafer in the cleaning composition, the cleaning composition has a temperature in a range of 40° C. to 80° C.

5. A cleaning composition for a semiconductor wafer, the cleaning composition comprising:
  (a) 3% to 50% by weight of nonionic surfactants represented by Formulas 1 and 2 having a weight ratio in a range of 3:1 to 1:3, respectively;
  (b) 0.1% to 1% by weight of an inorganic acid; and
  (c) the remaining proportion of water,
  wherein the Formula 1 is composed of Formula a1 or Formula a2, the Formula a1 is $C_nH_{2n+1}$—O-(EO)$_x$—H (n=2, x=12, EO=oxyethylene group), and the Formula a2 is $C_nH_{2n+1}$—O-(EO)$_x$—H (n=16, x=12, EO=oxyethylene group), and
  wherein the Formula 2 is composed of Formula b1 or Formula b2, the Formula b1 is $C_nH_{2n+1}$-(EO)$_x$—H (n=10, x=8, EO=oxyethylene group), and the Formula b2 is $C_nH_{2n+1}$-(EO)$_x$—H (n=13, x=8, EO=oxyethylene group).

6. The composition of claim 1, wherein the inorganic acid is one acid selected from a group consisting of phosphoric acid, nitric acid, sulfuric acid, or a mixture of two or more acids selected from the group.

* * * * *